(12) United States Patent
Lee et al.

(10) Patent No.: US 12,213,331 B2
(45) Date of Patent: Jan. 28, 2025

(54) HYBRID ORGANIC-INORGANIC LIGHT EMITTING DEVICE

(71) Applicant: The Regents of the University of Michigan, Ann Arbor, MI (US)

(72) Inventors: Byungjun Lee, Ann Arbor, MI (US); Jongchan Kim, Ann Arbor, MI (US); Stephen R. Forrest, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 349 days.

(21) Appl. No.: 17/585,384

(22) Filed: Jan. 26, 2022

(65) Prior Publication Data

US 2022/0271250 A1  Aug. 25, 2022

Related U.S. Application Data

(60) Provisional application No. 63/143,237, filed on Jan. 29, 2021.

(51) Int. Cl.
| | | |
|---|---|---|
| *H01L 51/50* | (2006.01) | |
| *H10K 50/11* | (2023.01) | |
| *H10K 50/13* | (2023.01) | |
| *H10K 50/85* | (2023.01) | |
| *H10K 71/00* | (2023.01) | |
| *H10K 50/15* | (2023.01) | |
| *H10K 50/17* | (2023.01) | |
| *H10K 101/40* | (2023.01) | |
| *H10K 102/00* | (2023.01) | |

(52) U.S. Cl.
CPC ............ *H10K 50/11* (2023.02); *H10K 50/13* (2023.02); *H10K 50/85* (2023.02); *H10K 71/00* (2023.02); *H10K 50/15* (2023.02); *H10K 50/17* (2023.02); *H10K 2101/40* (2023.02); *H10K 2102/00* (2023.02); *H10K 2102/351* (2023.02)

(58) Field of Classification Search
CPC ..... H10K 50/11; H10K 50/13; H10K 2101/40
See application file for complete search history.

(56) References Cited

U.S. PATENT DOCUMENTS

| | | |
|---|---|---|
| 4,769,292 A | 9/1988 | Tang |
| 5,247,190 A | 9/1993 | Friend |

(Continued)

FOREIGN PATENT DOCUMENTS

| | | |
|---|---|---|
| EP | 1238981 | 9/2002 |
| EP | 2150996 | 2/2010 |

(Continued)

OTHER PUBLICATIONS

Baldo et al., "Highly Efficient Phosphorescent Emission from Organic Electroluminescent Devices," Nature, vol. 395, pp. 151-154 (1998).

(Continued)

*Primary Examiner* — Anthony Ho
(74) *Attorney, Agent, or Firm* — Riverside Law LLP

(57) ABSTRACT

An organic electronic optoelectronic device comprises a substrate, a first electrode positioned over the substrate, a first organic buffer layer positioned over the first electrode, and a first inorganic emissive layer positioned over the first organic buffer layer. A method of fabricating an organic optoelectronic device is also disclosed.

10 Claims, 11 Drawing Sheets

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 5,895,932 A | 4/1999 | Bojarczuk, Jr. |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,964,439 B2 | 6/2011 | Kim |
| 7,968,146 B2 | 6/2011 | Wagner |
| 8,865,489 B2 * | 10/2014 | Rogers ............... H01L 25/0753 438/459 |
| 9,390,920 B2 | 7/2016 | Coe-Sullivan |
| 9,793,481 B2 | 10/2017 | Forrest |
| 10,062,738 B2 | 8/2018 | Forrest |
| 10,971,542 B2 | 4/2021 | Forrest |
| 2003/0230980 A1 | 12/2003 | Forrest |
| 2004/0174116 A1 | 9/2004 | Lu |
| 2013/0026452 A1 | 1/2013 | Kottas |
| 2013/0119354 A1 | 5/2013 | Ma |
| 2017/0012207 A1 | 1/2017 | Seo |
| 2018/0130853 A1 | 5/2018 | Pan |
| 2020/0291251 A1 | 9/2020 | Pan |
| 2022/0006027 A1 * | 1/2022 | Forrest ............... H10K 85/6576 |

FOREIGN PATENT DOCUMENTS

| | | |
|---|---|---|
| JP | 2010135467 | 6/2010 |
| WO | 2004111066 A1 | 12/2004 |
| WO | 2008044723 | 4/2008 |
| WO | 2008057394 A1 | 5/2008 |
| WO | 2010011390 A2 | 1/2010 |
| WO | 2010111175 | 9/2010 |

OTHER PUBLICATIONS

Baldo et al., "Very High-Efficiency Green Organic Light-Emitting Devices Based on Electrophosphorescence," Appl. Phys. Lett., vol. 75, No. 1, pp. 4-6 (1999).

Carlson, A. et al. Shear-enhanced adhesiveless transfer printing for use in deterministic materials assembly. Appl. Phys. Lett. 98, 264104 (2011).

Coburn, C. & Forrest, S. R. Effects of Charge Balance and Exciton Confinement on the Operational Lifetime of Blue Phosphorescent Organic Light-Emitting Diodes. Phys. Rev. Appl. 7, 1-5 (2017).

Coburn, C., Lee, J. & Forrest, S. R. Charge Balance and Exciton Confinement in Phosphorescent Organic Light Emitting Diodes. Adv. Opt. Mater. 4, 889-895 (2016).

Mukai, T. et al. Recent progress of nitride-based light emitting devices. Phys. Status Solidi A 200, 52-57 (2003).

Park, et al., Boosting Efficiency in Polycrystalline Metal Halide Perovskite Light-Emitting Diodes, ACS Energy Lett. 2019, 4, 1134-1149.

Shimojuku, M. et al. A damage-free sapphire substrate removal process to realize highly manufacturable wafer-level white LED package. in 2013 3rd IEEE CPMT Symposium Japan 1-2 (2013). doi: 10.1109/ICSJ.2013.6756103.

Srivastava, P. et al. Silicon Substrate Removal of GaN DHFETs for Enhanced (<1100 V) Breakdown Voltage. IEEE Electron Device Lett. 31, 851-853 (2010).

Yu, H. et al. Wafer-Scale Growth and Transfer of Highly-Oriented Monolayer MoS 2 Continuous Films. ACS Nano 11, 12001-12007 (2017).

Zhou, S. & Liu, S. Study on sapphire removal for thin-film LEDs fabrication using CMP and dry etching. Appl. Surf. Sci. 255, 9469-9473 (2009).

\* cited by examiner

HYBRID ORGANIC-INORGANIC LIGHT EMITTING DEVICE

CROSS-REFERENCE TO RELATED APPLICATIONS

This application claims priority to U.S. Provisional Patent Application No. 63/143,237, filed on Jan. 29, 2021, incorporated herein by reference in its entirety.

STATEMENT REGARDING FEDERALLY SPONSORED RESEARCH OR DEVELOPMENT

This invention was made with government support under W911-NF-17-0312 awarded by the U.S. Army Research Office. The government has certain rights in the invention.

BACKGROUND

Optoelectronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Organic light-emitting diodes have been the leading technology in displays for decades with the success of phosphorescent OLEDs (PhOLED). Albeit its success, RGB pixels fully composed of PhOLEDs have yet to be realized due to the short lived Phosphorescent blue OLEDs due to the remaining problems such as managing high-energy excited states. On the other hand, since the development of wafer scale growth of GaN, GaN/InGaN based blue LEDs have been prevailing in the lighting market due to its robustness and high efficiency. However, the cost of production and difficulties in sheet-scale growth on glass limited the GaN/InGaN based LEDs to continue its success in the display market. Micro-LED, which involves pick-and-place processing to fabricate the pixels one-by-one has been proposed, however due to the yield issues there are still a number of challenges that should be overcome.

SUMMARY OF THE DISCLOSURE

Some embodiments of the invention disclosed herein are set forth below, and any combination of these embodiments (or portions thereof) may be made to define another embodiment.

In one aspect, an organic optoelectronic device comprises a substrate, a first electrode positioned over the substrate, a first organic buffer layer positioned over the first electrode, and a first inorganic emissive layer positioned over the first organic buffer layer. In one embodiment, the device further comprises a first organic host layer positioned over the first organic buffer layer, wherein the first inorganic emissive layer is positioned within the first organic host layer. In one embodiment, the first inorganic emissive layer is positioned at a distance from an interface between the first organic buffer layer and the organic host layer of between 2.5 nm and 20 nm. In one embodiment, the distance is between 10 nm and 15 nm. In one embodiment, the distance is about 12 nm.

In one embodiment, the first inorganic emissive layer comprises a multi quantum well structure. In one embodiment, the first inorganic emissive layer is a blue emissive layer. In one embodiment, the first inorganic emissive layer comprises Gallium. In one embodiment, the first inorganic emissive layer is a monolayer. In one embodiment, the first inorganic emissive layer has a thickness of between 1 nm and 100 nm. In one embodiment, the device further comprises a second inorganic emissive layer positioned over the first inorganic emissive layer, the second inorganic emissive layer having a different chemical structure than the first inorganic emissive layer. In one embodiment, the device further comprises a second organic buffer layer positioned over the first inorganic emissive layer.

In one aspect, a product comprising an organic optoelectronic device as disclosed herein is selected from the group consisting of a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a micro-display, a 3-D display, a virtual reality or augmented reality display, a vehicle, a video wall comprising multiple displays tiled together, a theater or stadium screen, a light therapy device, and a sign.

In one aspect, a method for fabricating an organic optoelectronic device comprises providing a first substrate, depositing an inorganic buffer layer over the substrate, depositing an inorganic emissive layer stack comprising at least one inorganic emissive layer on the inorganic buffer layer, positioning a handle layer over the inorganic emissive layer stack, removing the at least one inorganic emissive layer and the handle layer from the inorganic buffer layer, aligning the at least one inorganic emissive layer to an organic buffer layer positioned on a second substrate, bonding the at least one inorganic emissive layer to the organic buffer layer, and removing the handle layer.

In one embodiment, the inorganic emissive layer stack comprises at least two inorganic emissive layers. In one embodiment, the at least one inorganic emissive layer is bonded using van der Waals interactions. In one embodiment, the handle layer is removed using etching. In one embodiment, the at least one inorganic emissive layer is deposited by growing an inorganic material on the inorganic buffer layer. In one embodiment, the method further comprises depositing a release layer between the inorganic buffer layer and the at least one inorganic emissive layer.

In one embodiment, the at least one inorganic emissive layer is a monolayer. In one embodiment, the inorganic emissive layer stack comprises a monolayer. In one embodiment, the inorganic emissive layer stack comprises a plurality of inorganic emissive layers, and at least a second inorganic emissive layer in the plurality of inorganic emissive layers remains positioned over the inorganic buffer layer when the at least one inorganic emissive layer and the handle layer are removed. In one embodiment, the method further comprises positioning a bonding layer between the at least one inorganic emissive layer and the handle layer. In one embodiment, the method further comprises depositing the bonding layer on a top surface of the at least one inorganic emissive layer. In one embodiment, the method further comprises depositing the bonding layer on a bottom surface of the handle layer. In one embodiment, the method further comprises depositing a first portion of the bonding layer on a top surface of the at least one inorganic emissive layer, and depositing a second portion of the bonding layer on a bottom surface of the handle layer. In one embodiment, the inorganic emissive layer stack comprises a multi quantum well structure.

BRIEF DESCRIPTION OF THE DRAWINGS

The foregoing purposes and features, as well as other purposes and features, will become apparent with reference to the description and accompanying figures below, which are included to provide an understanding of the disclosure and constitute a part of the specification, in which like numerals represent like elements, and in which.

DETAILED DESCRIPTION

Figure 1:
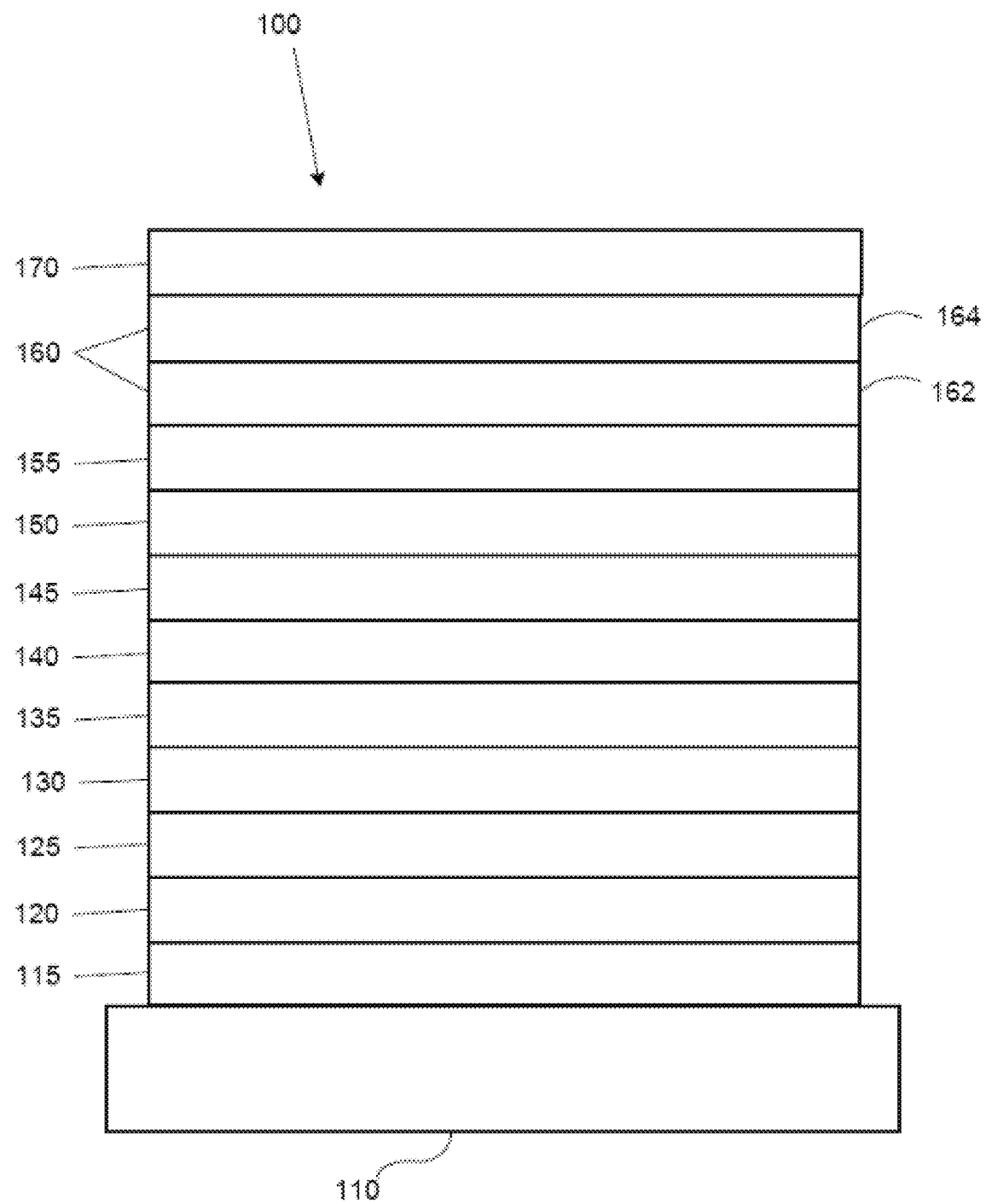
FIG. 1 shows an organic light emitting device in accordance with one embodiment.

It is to be understood that the figures and descriptions of the present disclosure have been simplified to illustrate elements that are relevant for a clear understanding of the present disclosure, while eliminating, for the purpose of clarity, many other elements found in related systems and methods. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the disclosure can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

As used herein, and as would be understood by one skilled in the art, "ITO" refers to Indium Tin Oxide, "GaN" refers to Gallium Nitride, "InGaN" refers to Indium Gallium Nitride, "AlN" refers to Aluminum Nitride, "PtOEP" refers to Platinum Octaethylporphyrin, "PDMS" refers to Polydimethylsiloxane, "TAPC" refers to 1,1-Bis[(di-4-tolylamino)phenyl]cyclohexane, "B3PYMPM" refers to 4,6-Bis(3,5-di(pyridin-3-yl)phenyl)-2-methylpyrimidine, "ITO" refers to Indium-Tin-Oxide, "IZO" refers to Indium-Zinc-Oxide, "PET" refers to Poly(ethyl benzene-1,4-dicarboxylate), "PEN" refers to PEN/Polyethylene naphthalate, "MoO3" refers to Molybdenum trioxide, "HATCN" refers to 1,4,5,8,9,11-Hexaazatriphenylenehexacarbonitrile, "NPD" refers to N,N'-Di(1-naphthyl)-N,N'-diphenyl-(1,1'-biphenyl)-4,4'-diamine, "CBP" refers to 4,4'-Bis(N-carbazolyl)-1,1'-biphenyl, "TCTA" refers to 4,4',4"-tris(carbazol-9-yl)-triphenylamine, "26DCzPPy" refers to 2,6-Bis(3-(9H-carbazol-9-yl)phenyl)pyridine, "CzSi" refers to 9-(4-tert-Butylphenyl)-3,6-bis(triphenylsilyl)-9H-carbazole, "AlGaInP" refers to Aluminum Gallium Indium Phosphide, "AlGaAs" refers to Aluminum Gallium Arsenide, "GaP" refers to Gallium Phosphide, "ZnSe" refers to Zinc Selenide, "ZnTe" refers to Zinc Telluride, "MgTe" refers to Magnesium Selenide, "BPhen" refers to 4,7-Diphenyl-1,10-phenanthroline, "TPBi" refers to 2,2', 2"-(1,3,5-Benzinetriyl)-tris(1-phenyl-1-H-benzimidazole, "BP4mPy" refers to BP4mPy/3,3', 5,5'-tetra[(M-pyridyl)-phen-3-yl]biphenyl, "TmPyPB" refers to 1,3,5-Tri(m-pyridin-3-ylphenyl)benzene, "B4PYMPM" refers to 4,6-Bis(3,5-di(pyridin-3-yl)phenyl)-2-methylpyrimidine, "LiQ" refers to 8-Quinolinolato lithium, "LiF" refers to Lithium Fluoride, "CBP:Irppy3" refers to a mixture of CBP and Irppy3 [Tris(2-phenylpyridine) Iridium(III)], "mCBP:Irdmp3" refers to a mixture of mCBP (3,3'-Di(9H-carbazol-9-yl)-1,1'-biphenyl) and Irdmp3 (tris[3-(2,6-dimethylphenyl)-7-methylimidazo[1,2-f]phenanthridine] Iridium (III)), and "CBP:Ir(MDQ)2(acac)" refers to a mixture of CBP and Ir(MDQ)2(acac) [Bis(2-methyldibenzo[f,h] quinoxaline)(acetylacetonate) Iridium(III)].

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
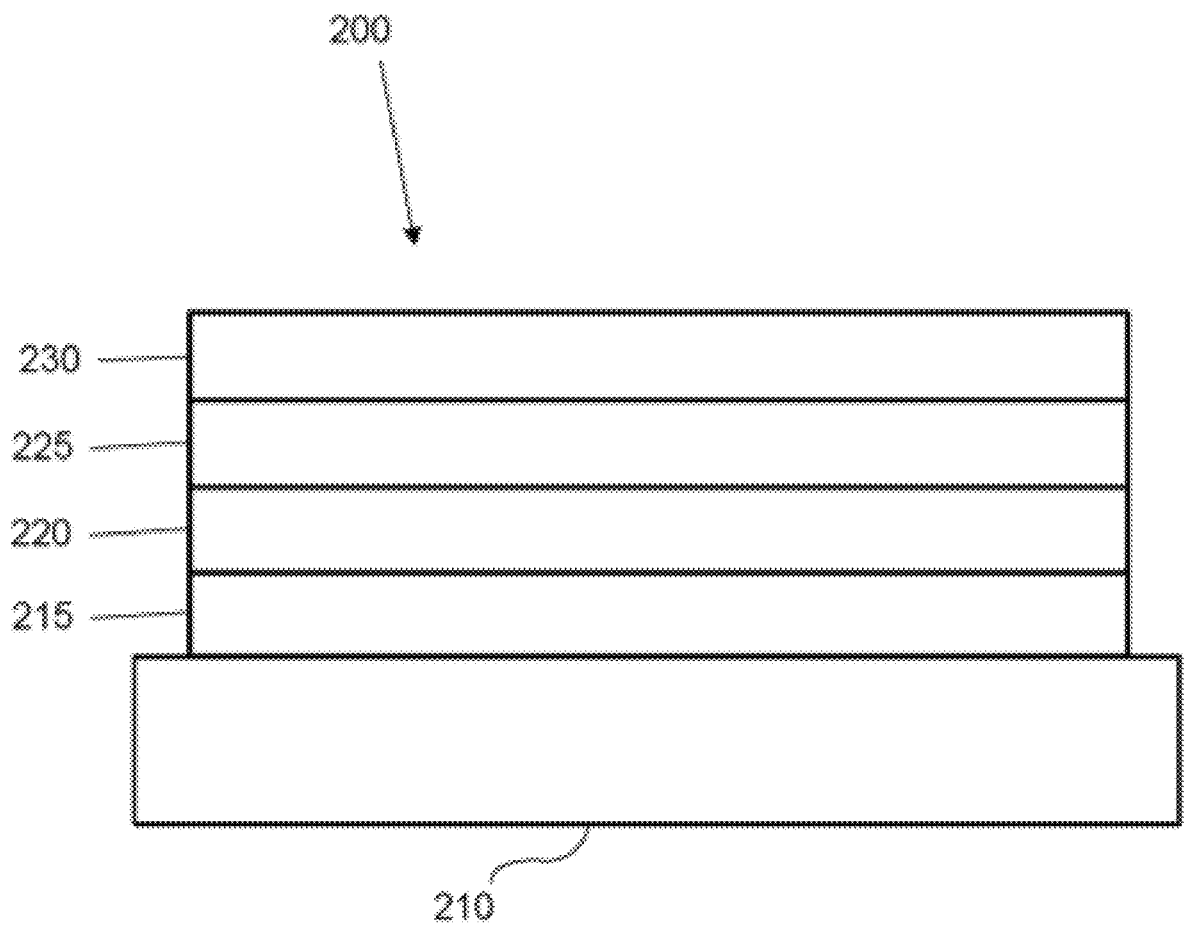
FIG. 2 shows an inverted organic light emitting device that does not have a separate electron transport layer in accordance with one embodiment.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIG. 1 and FIG. 2 is provided by way of non-limiting example, and it is understood that embodiments of the disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIG. 1 and FIG. 2.

Although certain embodiments of the disclosure are discussed in relation to one particular device or type of device (for example OLEDs) it is understood that the disclosed improvements to light outcoupling properties of a substrate may be equally applied to other devices, including but not limited to PLEDs, OPVs, charge-coupled devices (CCDs), photosensors, or the like.

Although exemplary embodiments described herein may be presented as methods for producing particular circuits or devices, for example OLEDs, it is understood that the materials and structures described herein may have applications in devices other than OLEDs. For example, other optoelectronic devices such as organic solar cells and organic photodetectors may employ the materials and structures. More generally, organic devices, such as organic transistors, or other organic electronic circuits or components, may employ the materials and structures.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

Certain embodiments of the disclosure relate to a light emitting device comprising an emissive layer (EML) spaced far from a cathode as described herein. Conventional organic light emitting devices typically place the EML near a metal cathode which incurs plasmon losses due to near field coupling. To avoid exciting these lossy modes it is necessary to space the EML far from the cathode. However, utilizing a thick electron transport layer (ETL) can be problematic due to changes in charge balance and increased resistivity. These problems can be overcome by utilizing a charge generation layer, for example a charge generation layer comprising at least one electron transport layer and at least one hole transport layer, to convert electron into hole current. This allows the use of higher mobility hole transporting materials and maintains the charge balance of the device. In some embodiments, the charge generation layer may be replaced or combined with any other layer capable of conducting electrons.

Disclosed is an example embodiment of a device combining two optical materials, InGaN/Gan and organics, by fabricating an LED comprising an InGaN/GaN active layer and organic buffer layers. Further disclosed is an example embodiment of a transfer method of III-V compound semiconductors and a design scheme that enables an efficient hybrid organic-inorganic LED. Since the robustness of the organic buffer layers is not the issue deteriorating the lifetime of PhOLEDs, the combination organic buffer layer and inorganic active layer would add up the strong point of each material, i.e. the low-cost, large area deposition and robust active layer.

With reference to FIGS. 3A-F, example embodiments of optoelectronic devices (300, 305, 310, 315, 320, 325) are depicted. The devices (300, 305, 310, 315, 320, 325) include a substrate 330, a first electrode 335 positioned over the substrate 330, a first organic buffer layer 340 positioned over the first electrode 335, and a first inorganic emissive layer 345 positioned over the first organic buffer layer 340.

Figure 3A:
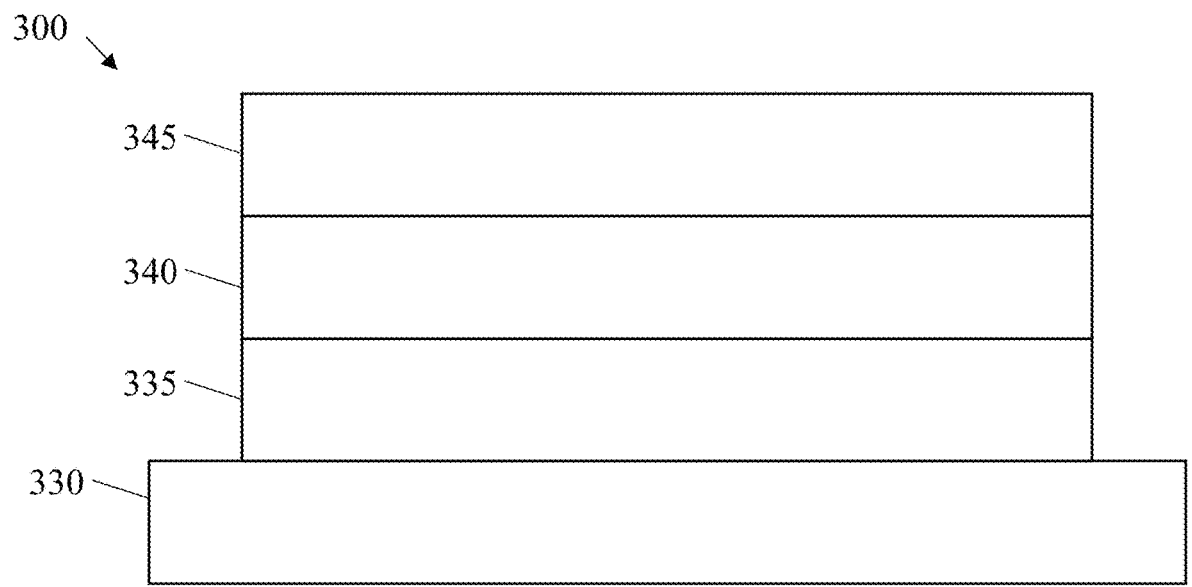
FIG. 3A shows an example optoelectronic device in accordance with one embodiment.

FIG. 3A shows an example embodiment of a devices 300. The device 300 includes a substrate 330, a first electrode 335 positioned over the substrate 330, a first organic buffer layer 340 positioned over the first electrode 335, and a first inorganic emissive layer 345 positioned over the first organic buffer layer 340.

Figure 3B:
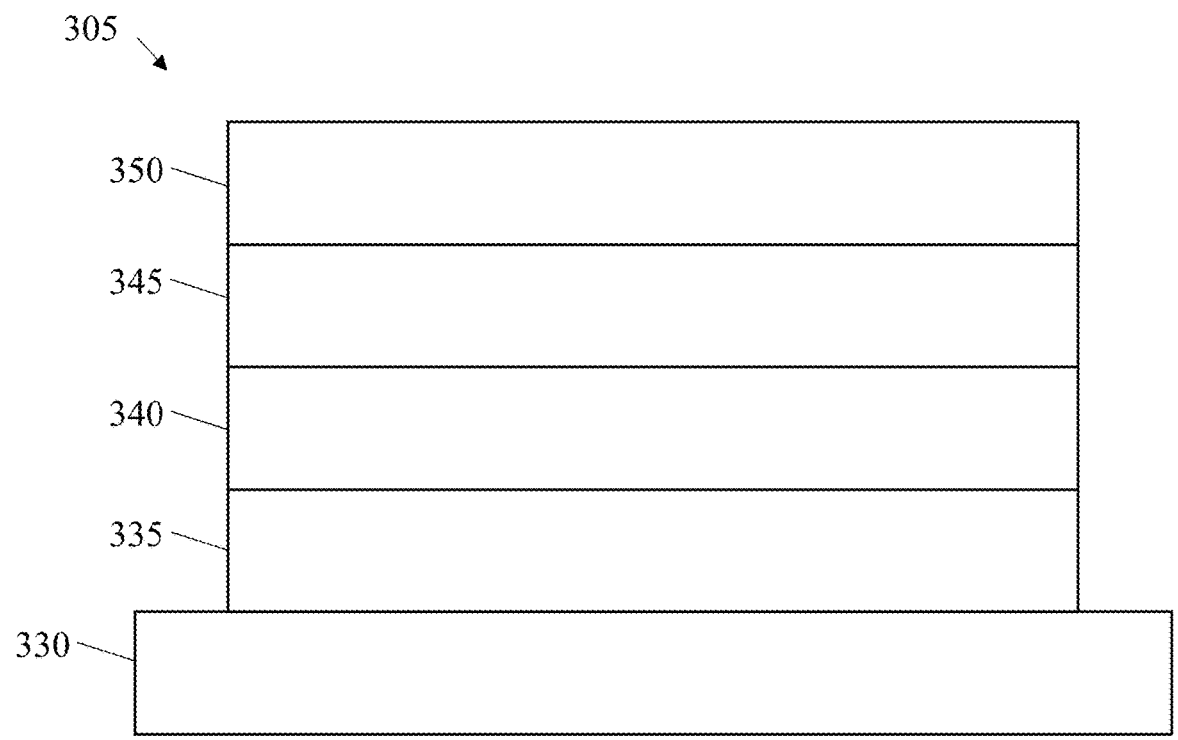
FIG. 3B shows an example optoelectronic device in accordance with one embodiment.

FIG. 3B shows another example embodiment of a device 305. The device 305 includes a substrate 330, a first electrode 335 positioned over the substrate 330, a first organic buffer layer 340 positioned over the first electrode 335, and a first inorganic emissive layer 345 positioned over the first organic buffer layer 340. The device 305 further includes a second inorganic emissive layer 350 positioned over the first inorganic emissive layer 345, where the second inorganic emissive 350 layer has a different chemical structure than the first inorganic emissive layer 345.

Figure 3C:
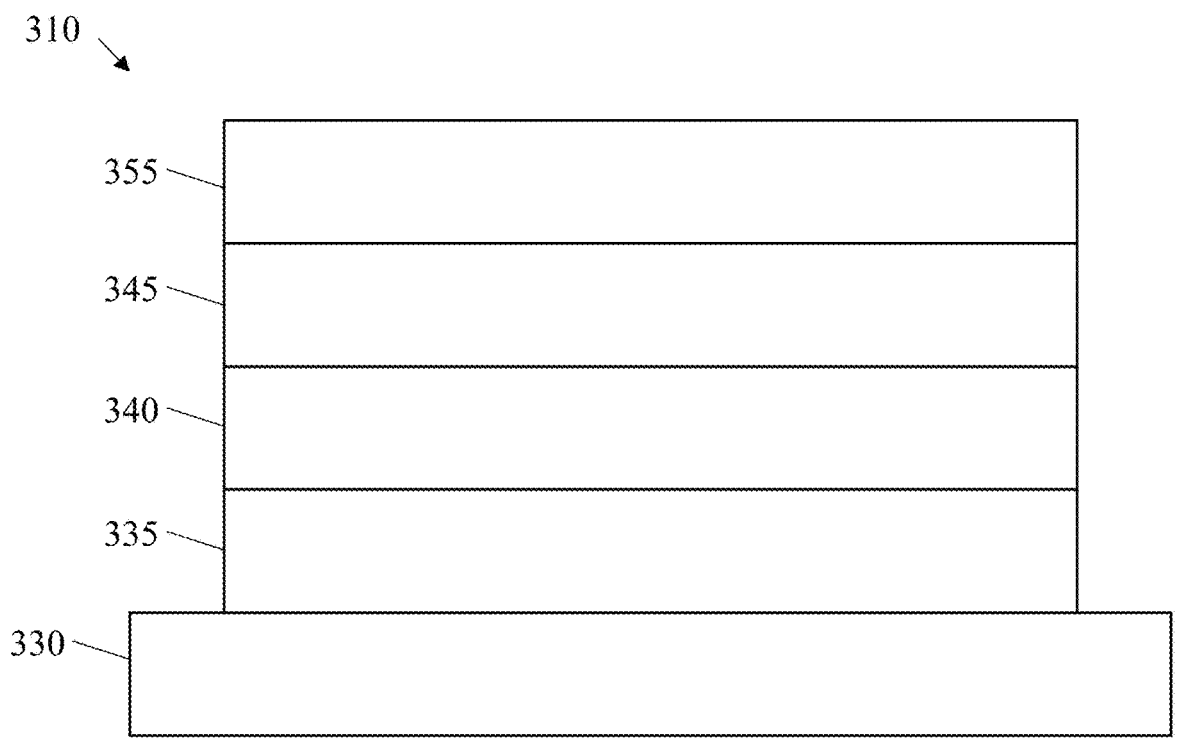
FIG. 3C shows an example optoelectronic device in accordance with one embodiment.

FIG. 3C shows another example embodiment of a device 310. The device 310 includes a substrate 330, a first electrode 335 positioned over the substrate 330, a first organic buffer layer 340 positioned over the first electrode 335, and a first inorganic emissive layer 345 positioned over the first organic buffer layer 340. The device 310 further includes a second organic buffer layer 355 positioned over the first inorganic emissive layer 345.

Figure 3D:
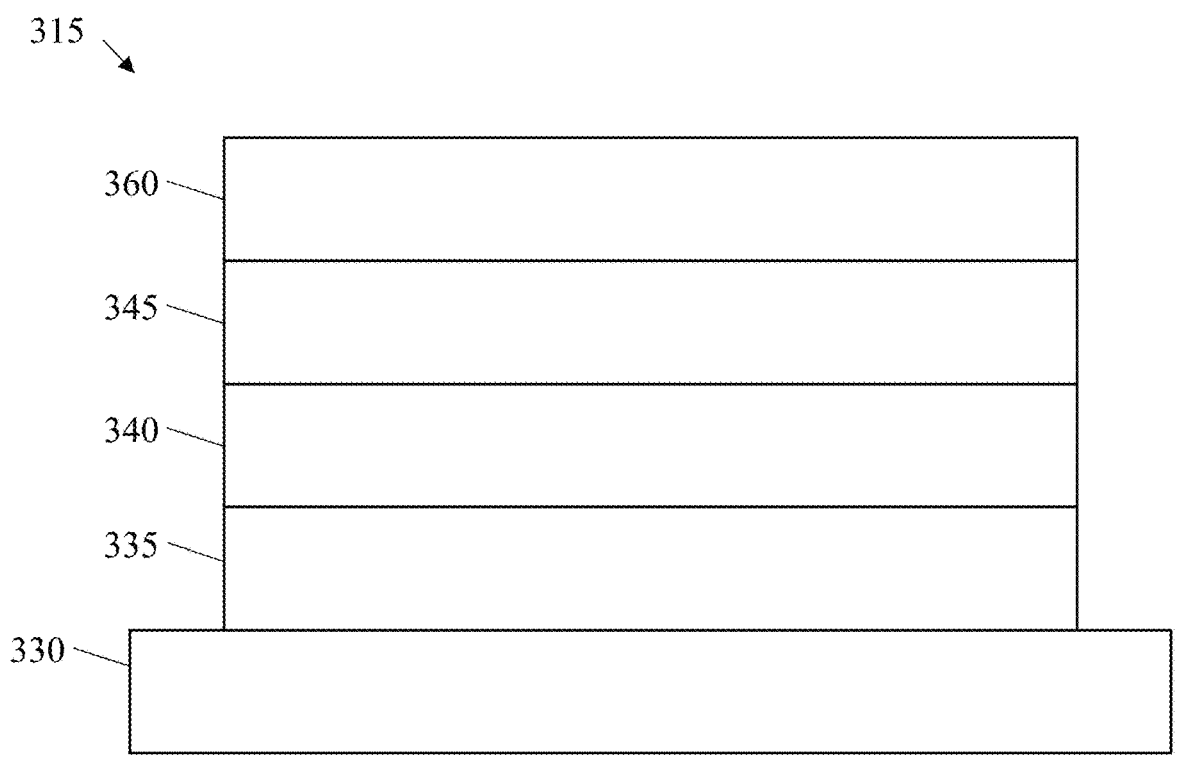
FIG. 3D shows an example optoelectronic device in accordance with one embodiment.

FIG. 3D shows another example embodiment of a device 315. The device 315 includes a substrate 330, a first electrode 335 positioned over the substrate 330, a first organic buffer layer 340 positioned over the first electrode 335, and a first inorganic emissive layer 345 positioned over the first organic buffer layer 340. The device 315 further includes an organic emissive layer 360 positioned over the organic buffer layer 340 and over the inorganic emissive layer 345.

Figure 3E:
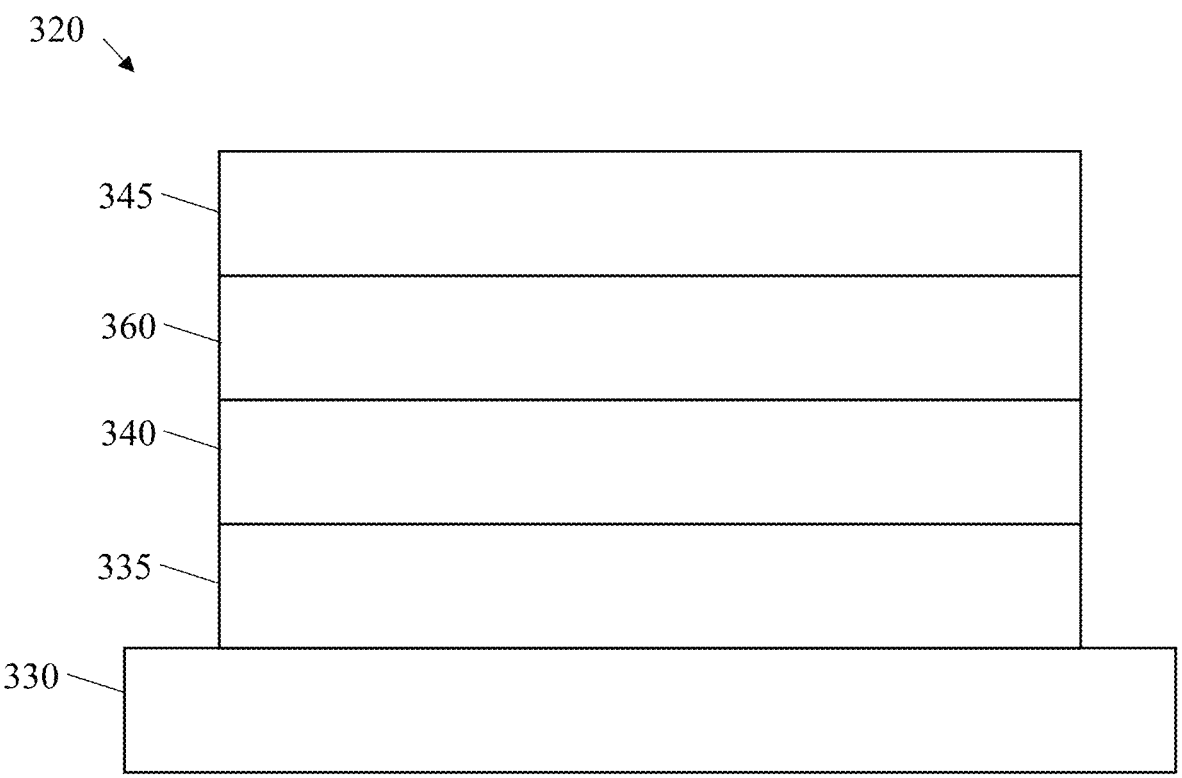
FIG. 3E shows an example optoelectronic device in accordance with one embodiment.

FIG. 3E shows another example embodiment of a device 320. The device 320 includes a substrate 330, a first electrode 335 positioned over the substrate 330, a first organic buffer layer 340 positioned over the first electrode 335, and a first inorganic emissive layer 345 positioned over the first organic buffer layer 340. The device 320 further includes an organic emissive layer 360 positioned between the organic buffer layer 340 and the inorganic emissive layer 345.

Figure 3F:
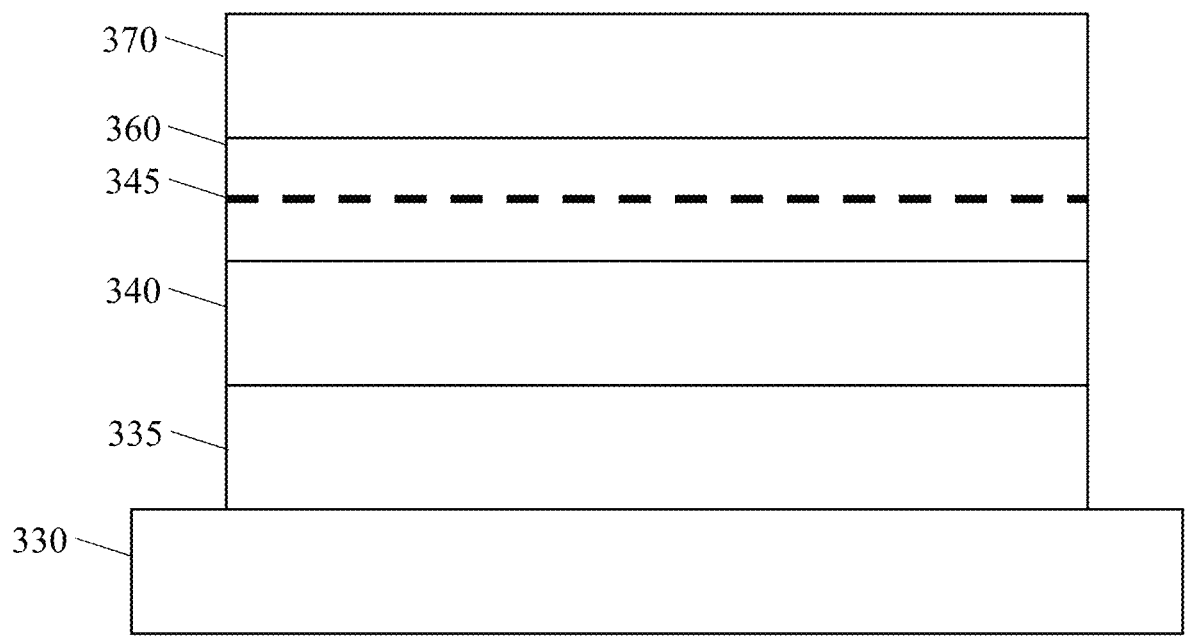
FIG. 3F shows an example optoelectronic device in accordance with one embodiment.

FIG. 3F shows another example embodiment of a device 325. The device 325 includes a substrate 330, a first electrode 335 positioned over the substrate 330, a first organic buffer layer 340 positioned over the first electrode 335, and a first inorganic emissive layer 345 positioned over the first organic buffer layer 340. The device 325 further includes an organic emissive layer 360 positioned above the organic buffer layer 340. In one embodiment, the first inorganic emissive layer 345 is positioned within the organic emissive layer 360. In one embodiment, the first inorganic emissive layer 345 is positioned at a distance from an interface between the first organic buffer layer 340 and the organic emissive layer 360 of between 2.5 nm and 20 nm. In one embodiment, the first inorganic emissive layer 345 to boundary distance is between 10 nm and 15 nm. In one embodiment, the first inorganic emissive layer 345 to boundary distance is about 12 nm.

In one embodiment, where a second organic buffer layer 370 is positioned over the organic emissive layer 360, the first inorganic emissive layer 345 is positioned at a distance from an interface between the second organic buffer layer 370 and the organic emissive layer 360 of between 2.5 nm and 20 nm. In one embodiment, the first inorganic emissive layer 345 to boundary distance is between 10 nm and 15 nm. In one embodiment, the first inorganic emissive layer 345 to boundary distance is about 12 nm.

The concepts of FIGS. 3A-F can further be combined to produce additional layer structuring. In one embodiment, the first inorganic emissive layer is a blue emissive layer. In one embodiment, the first inorganic emissive layer comprises Gallium. In one embodiment, the first inorganic emissive layer is a monolayer. In one embodiment, the first inorganic emissive layer has a thickness of between 1 nm and 100 nm.

The substrate 330 can be made of glass, or a transparent flexible substrate such as PET and PEN or other suitable materials, for example. The first electrode 335 can be made from Indium-Tin-Oxide (ITO), Indium-Zinc-Oxide (IZO), and thin silver (semitransparent), or other suitable materials, for example. The first organic buffer layer 340 can be made from hole injecting materials such as, for example, MoO3 and HATCN among other suitable materials, and from hole transport materials such as, for example, TAPC, NPD, CBP, TCTA, 26DCzPPy, and CzSi, among other suitable materials.

The first inorganic emissive layer 345 and the second inorganic emissive layer 350 can be made from, for example, GaN/InGaN for blue/green LEDs, AlGaInP for yellow, orange and red LEDs, AlGaAs for red and infrared LEDs, GaP for yellow and green LEDs, or other suitable materials. Additionally, 2-6 compound semiconductors can be used such as ZnSe, ZnTe, and MgTe, or other suitable materials, for example. Additionally, layers of mixed colors can be utilized to produce white light.

The second organic buffer layer 355 can be made from electron transport materials such as, for example, B3PYMPM, BPhen, TPBi, BP4mPy, TmPyPB, and B4PYMPM, among other suitable materials, and from electron injection materials such as, for example, LiQ, and LiF, among other suitable materials.

The organic emissive layer 360 can be a mixed host/guest system with a host and dopant material. An example of the material set can be, CBP:Irppy3 (green), mCBP:Irdmp3 (blue), CBP:IrMDQ (red), or other suitable materials.

The thicknesses of each layer (330, 335, 340, 345, 350, 355, 360) can range from about 50 nm to 10000 nm. The thicknesses can further depend on the thickness of the emissive layer. In some embodiments, if the thickness of either of the organic buffer layers (340, 355) exceeds about 100 nm may be doped with an n- or p-dopant such as, for example, Li, MoO3 or other suitable materials, to efficiently transport charges with low resistance.

Figure 4:
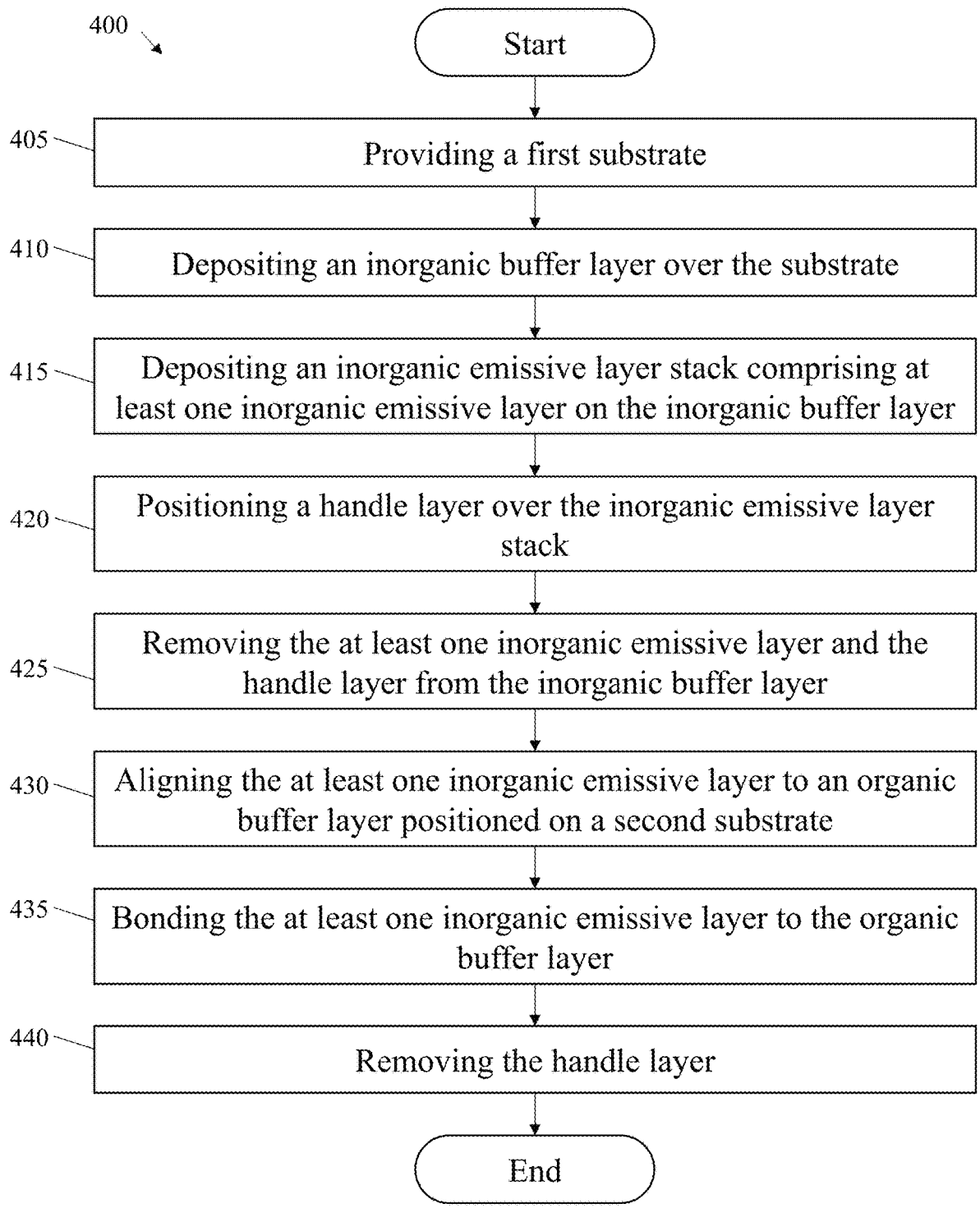
FIG. 4 is a flow chart depicting a method of fabricating an optoelectronic device in accordance with one embodiment.

FIG. 4 depicts a method 400 for fabricating an organic optoelectronic device. The method 400 begins at Operation 405 where a first substrate is provided. At Operation 410 an inorganic buffer layer is deposited over the substrate. At Operation 415 an inorganic emissive layer stack comprising at least one inorganic emissive layer 345 is deposited on the inorganic buffer layer. At Operation 420 a handle layer is positioned over the inorganic emissive layer stack. At Operation 425 the at least one inorganic emissive layer 345 and the handle layer are removed from the inorganic buffer layer. At Operation 430, the at least one inorganic emissive layer 345 is aligned to an organic buffer layer 340 positioned on a second substrate 330. At Operation 435 the at least one inorganic emissive layer 345 is bonded to the organic buffer layer 340. At Operation 440 the handle layer is removed.

In one embodiment, the inorganic emissive layer stack comprises at least two inorganic emissive layers. In one embodiment, the at least one inorganic emissive layer is bonded using van der Waals interactions. In one embodiment, the handle layer is removed using etching. In one embodiment, the at least one inorganic emissive layer is deposited by growing an inorganic material on the inorganic buffer layer. In one embodiment, the method further comprises depositing a release layer between the inorganic buffer layer and the at least one inorganic emissive layer. In one embodiment, the at least one inorganic emissive layer is a monolayer. In one embodiment, the inorganic emissive layer stack comprises a monolayer. In one embodiment, the inorganic emissive layer stack comprises a plurality of inorganic emissive layers, and at least a second inorganic emissive layer in the plurality of inorganic emissive layers remains positioned over the inorganic buffer layer when the at least one inorganic emissive layer and the handle layer are removed.

In one embodiment, the method further comprises positioning a bonding layer between the at least one inorganic emissive layer and the handle layer. In one embodiment, the method further comprises depositing the bonding layer on a top surface of the at least one inorganic emissive layer. In one embodiment, the method further comprises depositing the bonding layer on a bottom surface of the handle layer. In one embodiment, the method further comprises depositing a first portion of the bonding layer on a top surface of the at least one inorganic emissive layer, and depositing a second portion of the bonding layer on a bottom surface of the handle layer.

Devices of the present disclosure may comprise one or more electrodes, some of which may be fully or partially transparent or translucent. In some embodiments, one or more electrodes comprise indium tin oxide (ITO) or other transparent conductive materials. In some embodiments, one or more electrodes may comprise flexible transparent and/or conductive polymers.

Layers may include one or more electrodes, organic emissive layers, electron- or hole-blocking layers, electron- or hole-transport layers, buffer layers, or any other suitable layers known in the art. In some embodiments, one or more of the electrode layers may comprise a transparent flexible material. In some embodiments, both electrodes may comprise a flexible material and one electrode may comprise a transparent flexible material.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIG. 1 and FIG. 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In general, the various layers of OLEDs and similar devices described herein may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer sub stituents may be used to enhance the ability of small molecules to undergo solution processing.

Some OLED structures and similar devices may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theaters or stadium screens, light therapy devices, and signs. Various control mechanisms may be used to control devices fabricated in accordance with the present disclosure, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials, structures, and techniques described herein may have applications in devices other than the fabrication of OLEDs. For example, other optoelectronic devices such as organic solar cells and organic photodetectors may employ the materials and structures. More generally, organic devices, such as organic transistors, may employ the materials and structures.

An OLED fabricated using devices and techniques disclosed herein may have one or more characteristics selected from the group consisting of being flexible, being rollable, being foldable, being stretchable, and being curved, and may be transparent or semi-transparent. In some embodiments, the OLED further comprises a layer comprising carbon nanotubes.

In some embodiments, an OLED fabricated using devices and techniques disclosed herein further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

An OLED fabricated according to techniques and devices disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL

A hole injecting/transporting material to be used in the present disclosure is not particularly limited, and any compound may be used as long as the compound is typically used as a hole injecting/transporting material.

EBL

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

The CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, OLEDs and other similar devices may be fabricated using a variety of techniques and devices. For example, in OVJP and similar techniques, one or more jets of material is directed at a substrate to form the various layers of the OLED.

EXPERIMENTAL EXAMPLES

The disclosure is further described in detail by reference to the following experimental examples. These examples are provided for purposes of illustration only, and are not intended to be limiting unless otherwise specified. Thus, the disclosure should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present disclosure. The following working examples therefore, specifically point out the exemplary embodiments of the present disclosure, and are not to be construed as limiting in any way the remainder of the disclosure.

Device Fabrication and Measurements

An example hybrid device was fabricated, and various experimental measurements were performed.

Results

FIGS. 5, 6, 7, 8 and 9 describe example experimental details and results for a hybrid organic-inorganic optoelectronic device.

Figure 5:
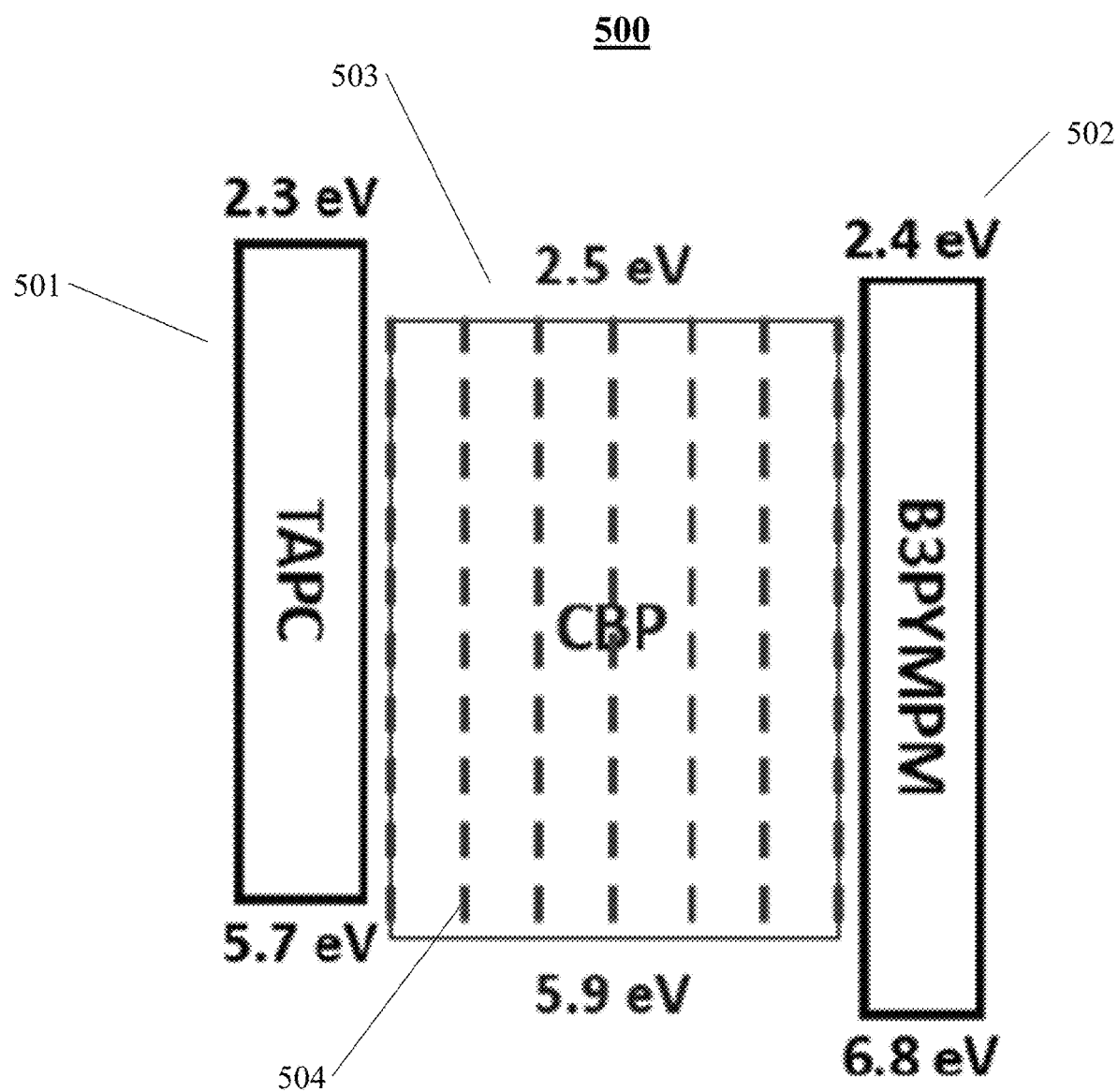
FIG. 5 shows an example experimental optoelectronic device in accordance with one embodiment.
Figure 6:
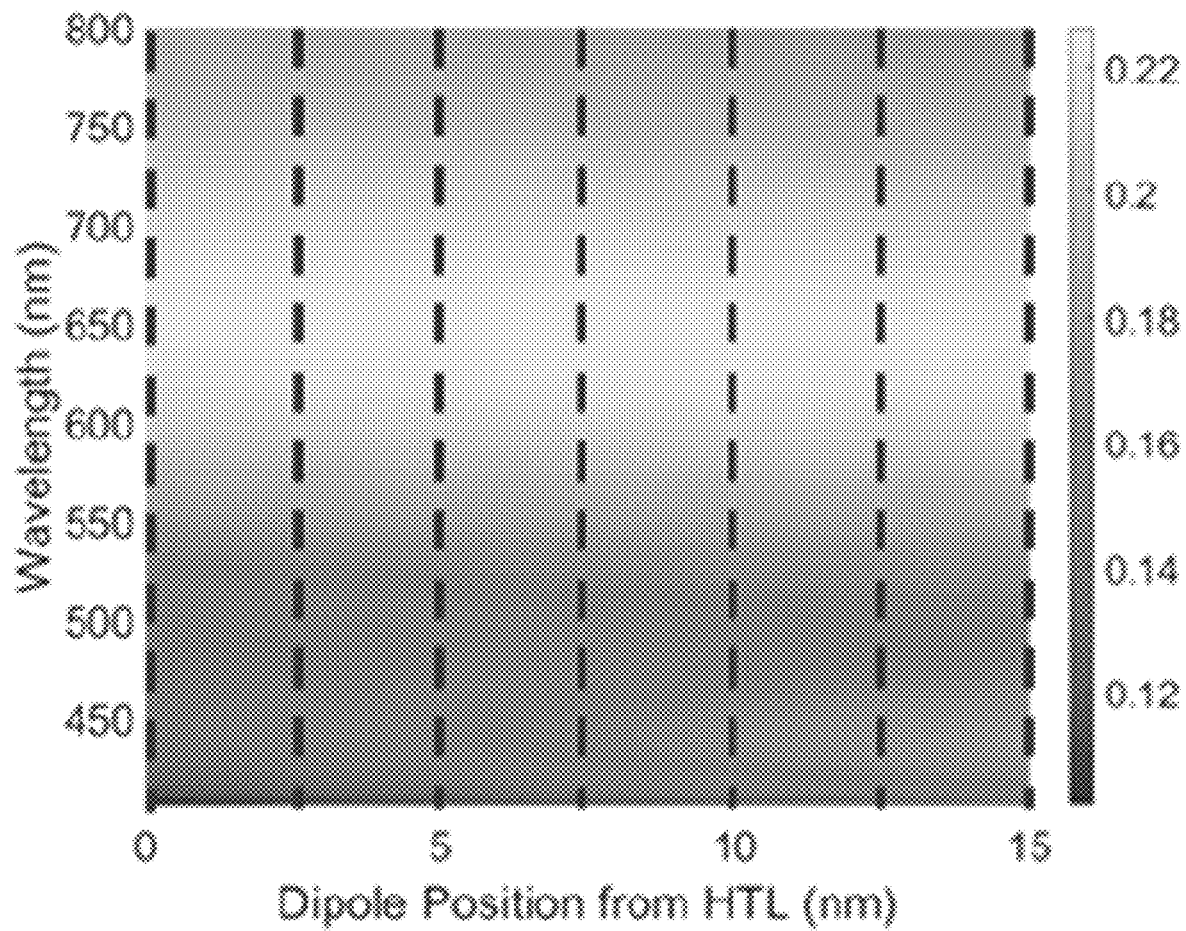
FIG. 6 shows an example experimental outcoupling efficiency of an optoelectronic device in accordance with one embodiment.
Figure 7:
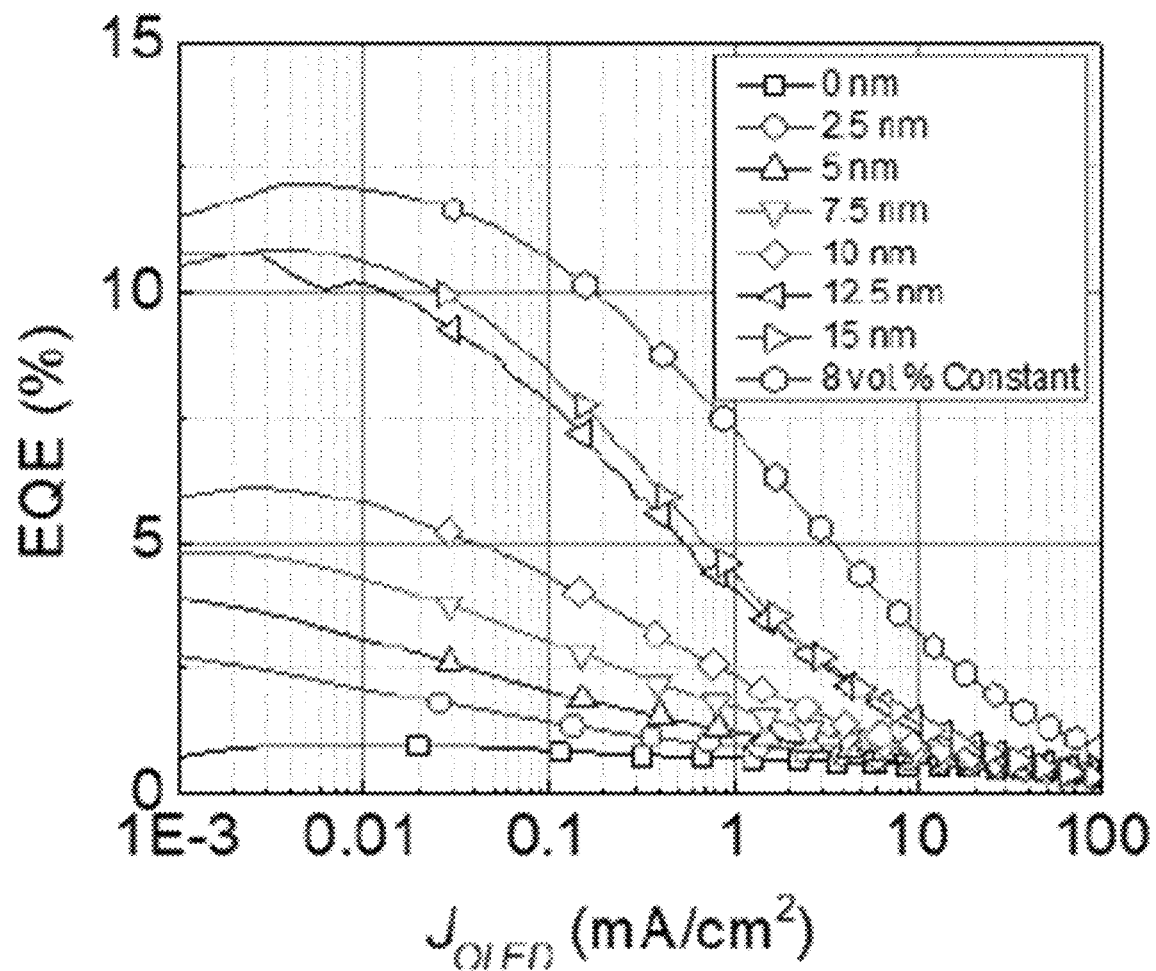
FIG. 7 shows an example experimental external quantum efficiency of an optoelectronic device in accordance with one embodiment.

FIG. 5 shows the locations of each slab layer, where each slab comprises of 0.5 Å thick PtOEP, FIG. 6 shows the outcoupling efficiency at each slab location, and FIG. 7 shows the measured external quantum efficiency of different slab location devices.

An example experimental device structure is provided in FIG. 5, showing the hole transport layer 501, and the electron transport layer 502. The buffer layers 501 and 502 enable an efficient charge injection/transport which is crucial to achieve good electrical property. An example used in this concept demonstration is 1,1-Bis[(di-4-tolylamino)phenyl] cyclohexane (TAPC) for the hole transport layer 501 and 4,6-Bis(3,5-di(pyridin-3-yl)phenyl)-2-methylpyrimidine (B3PYMPM) for the electron transport layer 502. The thickness of the electron transport layer 502 is in some embodiments greater than 35 nm to prevent severe surface plasmon polariton mode coupling losses. In some embodiments, the thickness of the electron transport layer 501 may be greater than 10 nm, greater than 15 nm, greater than 20 nm, greater than 25 nm, greater than 30 nm, greater than 40 nm, greater than 45 nm, or greater than 50 nm. In some embodiments, the hole transport layer 502 is at least 5 nm thick to prevent Forster transfer of the formed excitons within the emissive layers. In some embodiments, the hole transport layer 502 is at least 2 nm thick, at least 3 nm thick, at least 10 nm thick, at least 15 nm thick, or at least 20 nm thick. The emissive layer 503 is comprised of an organic host, which in the depicted embodiment is 4,4'-Bis(N-carbazolyl)-1,1'-biphenyl (CBP), but which in other embodiments could comprise one or more other suitable organic host materials. The organic host material in emissive layer 503 generates excitons due to the energy barrier formed at the hole and transport layer interface. This organic host layer would not be necessary if the charges could be efficiently injected into the InGaN/GaN layer 504 from the hole and electron transport layers 501 and 502. The thickness of the organic host layer should not exceed 5 nm to allow efficient Forster transfer of the generated excitons, whereas the thickness of the active material, InGaN/GaN depends on the efficiency of the multi quantum well structure.

In some embodiments, an emissive layer 503 of a device as contemplated herein may comprise an organic host material having a thickness extending from a first hole transport layer contact surface to a second electron transport layer contact surface, wherein the total thickness of the emissive layer is at least 5 nm, at least 10 nm, at least 15 nm, at least 20 nm, at least 25 nm, at least 30 nm, at least 35 nm, at least 40 nm, at least 50 nm, at least 60 nm, at least 70 nm, at least 80 nm, at least 90 nm, or at least 100 nm. The emissive layer 503 may further comprise one or more active layers parallel to one or both of the contact surfaces, comprising an inorganic emissive material, for example GaN or InGaN. In some embodiments, one or more active layers may comprise a multi quantum well (MQW). Each active layer may in various embodiments comprise one or more monolayers of the inorganic emissive material, in some embodiments between 1-5 monolayers, between 1-10 monolayers, between 1-20 monolayers, or between 1-50 monolayers, and may in some embodiments have a thickness of less than 2 nm, less than 5 nm, less than 8 nm, less than 10 nm, or less than 20 nm.

In various embodiments, one or more active layers may be positioned within the emissive layer 503 at a distance from the interface between the emissive layer 503 and either transport layer (e.g. electron transport layer 501 or hole transport layer 502) of 0 nm, at least 1 nm, at least 2 nm, at least 3 nm, at least 5 nm, at least 10 nm, at least 20 nm, at least 30 nm, at least 40 nm, about 1 nm, about 2 nm, about 3 nm, about 5 nm, about 10 nm, about 20 nm, about 30 nm, about 40 nm, at any position in between, or at any other suitable distance from the interface.

In some embodiments, an active layer may be positioned within a host/emissive layer, the host/emissive layer extending from a first charge transport layer on a first face of the host/emissive layer to a second charge transport layer on a second face of the host/emissive layer, where one charge transport layer is an electron transport layer and the other charge transport layer is a hole transport layer. The positioning of the active layer within the host material of the host/emissive layer may be determined by the charge transport characteristic of the emissive layer as a whole, and whether the emissive layer as a whole is hole- or electron-dominant. Where an emissive layer is more electron-dominant, the active layer may be positioned closer to the electron transport layer, and where an emissive layer is more hole dominant, the active layer may be positioned closer to the hole transport layer. In some embodiments, the active layer is positioned near or at the position in the emissive layer where exciton density is at its peak.

To design a suitable device structure for maximum charge injection an optimum organic layer design to generate maximum density of excitons in the active layer needed to be identified. The exciton density profile was used to determine where to put the inorganic active layer, comprising GaN or InGaN for example, within the emissive layer. The delta sensing layer method was used to map the exciton density profile following Equation 1:

$$I_{sense}=F_N(x)\eta_{oc}(x)\Phi(x)E_{ph}$$

Equation 1 where $I_{sense}$ is the measured intensity, $F_N(x)$ is the density of the excitons, $\eta_{oc}(x)$ is the outcoupling efficiency, $\Phi(x)$ is the sensing layer PL quantum yield and $E_{ph}$ is the average photon energy from the sensing molecule.

A 0.5 Å thick slab of red phosphorescent emitter, PtOEP (Platinum Octaethylporphyrin), was used as the sensing layer. Since the same amount of PtOEP was used for each slab sensing layer, $\Phi(x)$ and $E_{ph}$ are identical at all positions. Thus, $F_N(x)$ could be derived by measuring the external quantum efficiencies (EQE) and calculating the outcoupling efficiencies at different locations (x).

A slab of PtOEP was deposited from the hole transport layer (HTL)—emissive layer (EML) interface to the EML—electron transport layer (ETL) interface at 2.5 nm intervals as shown in FIG. 5. The calculated outcoupling efficiencies of the dipoles at different positions within the EML and the measured EQE is shown in FIGS. 6 and 7, respectively.

Figure 8:
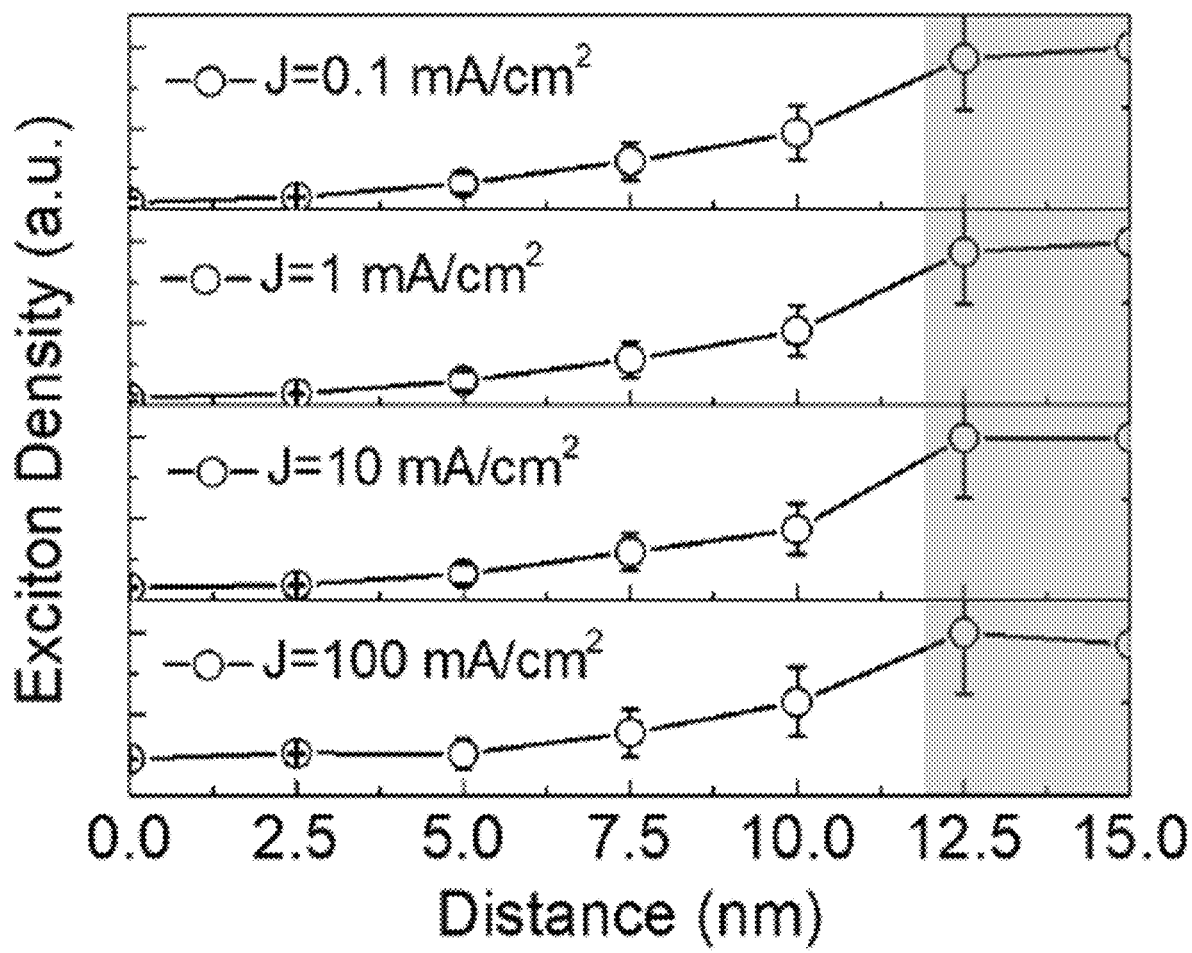
FIG. 8 shows an example experimental exciton density profile of an optoelectronic device in accordance with one embodiment.

FIG. 8 shows the exciton density profile withing the EML, where the exciton density profile was obtained withing the emissive layer with relative counts at current densities of J=0.1, 1, 10, 100 mA/cm². The calculated density of the excitons in FIG. 8 shows that the maximum exciton formation is in the EML-ETL interface. Thus, the InGaN/GaN was located at the x=12 nm position.

Figure 9:
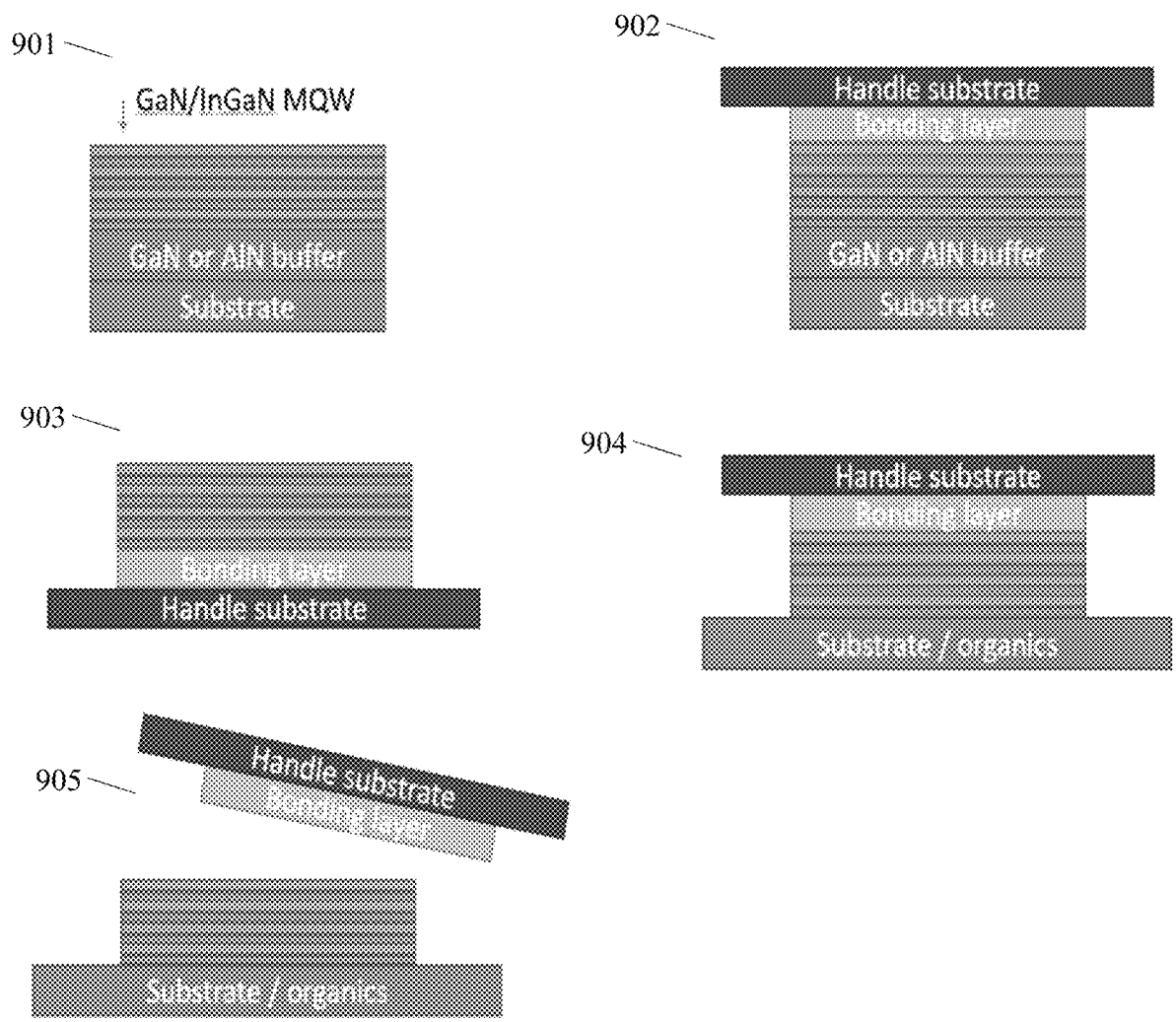
FIG. 9 shows a schematic of an example transfer process of an inorganic active layer onto an organic layer in accordance with one embodiment.

FIG. 9 shows a schematic of a transfer process of the InGaN/GaN active layer onto the organic layer from the grown substrate, where Image 901 shows the growth of InGaN/GaN on top of Si or sapphire substrate, Image 902 shows bonding the multi quantum well (MQW) structure onto a secondary handle substrate, Image 903 shows separation of initial substrate via chemical mechanical polishing, laser lift-off or etching, Image 904 shows Van der Waals bonding of MQW structure on the secondary handle wafer onto the organic layer, and Image 905 shows separation of the handle substrate, leaving MQW on top of the organic substrate for further processing. As it was intended to transfer the InGaN/GaN multi quantum well active layer for emission, a p or n-type GaN contact layer in a conventional InGaN/GaN LED is unnecessary.

Therefore, an AlN or GaN buffer layer and an InGaN/GaN MQW layer can be directly grown on top of a sapphire or Si substrate, see Image 901. After the growth, the MQW layer on top can be bonded onto a secondary handle substrate, such as Kapton or PDMS, which are relatively easier materials to be released or etched compared to the initial substrate, see Image 902. For transfer of the MQW structure, the initial substrate is removed via several separation methods and/or etching, see Image 903. Then, the MQW structure can be aligned onto the organic layer and bonded using van der Waals interactions, which is a conventional transfer method for 2-D materials, see Image 904. Afterwards, the secondary handle layer can either be etched away and/or separated from the organic/MQW structure, see Image 905, thus leaving the GaN/InGaN MQW structure on top of organic layer, ready for following organic layer deposition. Non-destructive removal of the MQW layers from the host sapphire is done by etching of a release layer (e.g. ultrathin AlAs released with HCl). Further, single InGaN layers can be grown avoiding an MQW, also released from the substrate. Another possibility is that the MQW itself can be selectively etched to remove only 1 InGaN layer per transfer, thus using a single growth of multiple InGaN/GaN layer stack to release 1 luminescent layer per transfer per OLED wafer. Luminescent InGaN layers can be as thin as 1 monolayer or can be many atomic layers thick to a thickness of several 10s of nanometers.

The following references are incorporated by reference in their entirety:

Coburn, C. & Forrest, S. R. Effects of Charge Balance and Exciton Confinement on the Operational Lifetime of Blue Phosphorescent Organic Light-Emitting Diodes. Phys. Rev. Appl. 7, 041002 (2017).

Coburn, C., Lee, J. & Forrest, S. R. Charge Balance and Exciton Confinement in Phosphorescent Organic Light Emitting Diodes. Adv. Opt. Mater. 4, 889-895 (2016).

Mukai, T. et al. Recent progress of nitride-based light emitting devices. Phys. Status Solidi A 200, 52-57 (2003).

Zhou, S. & Liu, S. Study on sapphire removal for thin-film LEDs fabrication using CMP and dry etching. Appl. Surf. Sci. 255, 9469-9473 (2009).

Srivastava, P. et al. Silicon Substrate Removal of GaN DHFETs for Enhanced (<1100 V) Breakdown Voltage. IEEE Electron Device Lett. 31, 851-853 (2010).

Shimojuku, M. et al. A damage-free sapphire substrate removal process to realize highly manufacturable wafer-level white LED package. in 2013 3rd IEEE CPMT Symposium Japan 1-2 (2013). doi:10.1109/ICSJ.2013.6756103.

Yu, H. et al. Wafer-Scale Growth and Transfer of Highly-Oriented Monolayer MoS 2 Continuous Films. ACS Nano 11, 12001-12007 (2017).

Carlson, A. et al. Shear-enhanced adhesiveless transfer printing for use in deterministic materials assembly. Appl. Phys. Lett. 98, 264104 (2011).

The disclosures of each and every patent, patent application, and publication cited herein are hereby incorporated herein by reference in their entirety. While devices and methods have been disclosed with reference to specific embodiments, it is apparent that other embodiments and variations of this disclosure may be devised by others skilled in the art without departing from the true spirit and scope of the disclosure. The appended claims are intended to be construed to include all such embodiments and equivalent variations.

The invention claimed is:

1. An organic optoelectronic device, comprising:
   a substrate;
   a first electrode positioned over the substrate;
   a first organic buffer layer positioned over the first electrode; and
   a first inorganic emissive layer positioned over the first organic buffer layer.

2. The organic optoelectronic device of claim 1, further comprising a first organic host layer positioned over the first organic buffer layer, wherein the first inorganic emissive layer is positioned within the first organic host layer.

3. The organic optoelectronic device of claim 2, wherein the first inorganic emissive layer is positioned at a distance from an interface between the first organic buffer layer and the organic host layer of between 2.5 nm and 20 nm.

4. The organic optoelectronic device of claim 3, wherein the distance is between 10 nm and 15 nm.

5. The organic optoelectronic device of claim 2, wherein the first inorganic emissive layer comprises a multi quantum well structure.

6. The organic optoelectronic device of claim 1, wherein the first inorganic emissive layer is a blue emissive layer.

7. The organic optoelectronic device of claim 1, wherein the first inorganic emissive layer is a monolayer.

8. The organic optoelectronic device of claim 1, wherein the first inorganic emissive layer has a thickness of between 1 nm and 100 nm.

9. The organic optoelectronic device of claim 1, further comprising a second inorganic emissive layer positioned over the first inorganic emissive layer, the second inorganic emissive layer having a different chemical structure than the first inorganic emissive layer.

10. A product comprising the organic optoelectronic device of claim 1, the product selected from the group consisting of a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a micro-display, a 3-D display, a virtual reality or augmented reality display, a vehicle, a video wall comprising multiple displays tiled together, a theater or stadium screen, a light therapy device, and a sign.

* * * * *